(12) United States Patent
Levy et al.

(10) Patent No.: US 11,972,999 B2
(45) Date of Patent: Apr. 30, 2024

(54) UNLANDED THERMAL DISSIPATION PILLAR ADJACENT ACTIVE CONTACT

(71) Applicant: GlobalFoundries U.S. Inc., Malta, NY (US)

(72) Inventors: Mark D. Levy, Williston, VT (US); Rajendran Krishnasamy, Essex Junction, VT (US); Michael J. Zierak, Colchester, VT (US); Siva P. Adusumilli, South Burlington, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 43 days.

(21) Appl. No.: 17/643,023

(22) Filed: Dec. 7, 2021

(65) Prior Publication Data
US 2023/0178449 A1 Jun. 8, 2023

(51) Int. Cl.
*H01L 23/367* (2006.01)
*H01L 23/373* (2006.01)
*H01L 29/417* (2006.01)
*H01L 29/732* (2006.01)

(52) U.S. Cl.
CPC ........ *H01L 23/367* (2013.01); *H01L 23/3736* (2013.01); *H01L 29/41708* (2013.01); *H01L 29/7325* (2013.01)

(58) Field of Classification Search
None
See application file for complete search history.

(56) References Cited

U.S. PATENT DOCUMENTS

| | | | |
|---|---|---|---|
| 6,288,426 B1 | 9/2001 | Gauthier, Jr. et al. | |
| 7,960,827 B1* | 6/2011 | Miller, Jr. | H01L 25/0657 257/E23.08 |
| 8,461,631 B2 | 6/2013 | Simin et al. | |
| 9,362,198 B2 | 6/2016 | Viswanathan et al. | |
| 10,157,788 B2 | 12/2018 | Pellizzer et al. | |
| 2002/0084524 A1* | 7/2002 | Roh | H01L 23/3677 257/E23.101 |
| 2008/0102584 A1 | 5/2008 | Kerr et al. | |
| 2010/0019385 A1 | 1/2010 | Bartley et al. | |

(Continued)

FOREIGN PATENT DOCUMENTS

EP 2395548 A1 12/2011

OTHER PUBLICATIONS

European Search Report dated May 10, 2023 for EP Application 22205725.9; pp. 11.

(Continued)

*Primary Examiner* — Khaja Ahmad
(74) *Attorney, Agent, or Firm* — Francois Pagette; Hoffman Warnick LLC

(57) ABSTRACT

A structure includes an electrical device, and an active contact landed on a portion of the electrical device. The active contact includes a first body of a first material. A thermal dissipation pillar is adjacent the active contact and unlanded on but over the portion of the electrical device. The thermal dissipation pillar includes a second body of a second material having a higher thermal conductivity than the first material. The thermal dissipation pillar may be in thermal communication with a wire in a dielectric layer over the active contact and the thermal dissipation pillar. The electrical device can be any integrated circuit device that generates heat.

20 Claims, 7 Drawing Sheets

(56) References Cited

U.S. PATENT DOCUMENTS

| | | | |
|---|---|---|---|
| 2011/0095364 A1* | 4/2011 | Stecher | H01L 29/0692 |
| | | | 257/337 |
| 2014/0001655 A1* | 1/2014 | Ding | H01L 23/36 |
| | | | 257/782 |
| 2014/0091445 A1* | 4/2014 | Teh | H01L 25/18 |
| | | | 257/E21.705 |
| 2014/0131860 A1 | 5/2014 | Kanda et al. | |
| 2015/0243578 A1 | 8/2015 | Botula et al. | |
| 2016/0225689 A1* | 8/2016 | Perkins | H01L 23/15 |
| 2017/0062595 A1 | 3/2017 | Dungan et al. | |
| 2018/0211897 A1 | 7/2018 | Yang et al. | |
| 2020/0295166 A1* | 9/2020 | Dasgupta | H01L 29/0817 |
| 2021/0043538 A1 | 2/2021 | Yan et al. | |

OTHER PUBLICATIONS

U.S. Appl. No. 17/156,634, filed Jan. 25, 2021, entitled "A Semiconductor Structure Having a Thermal Shunt Below a Metallization Layer and Integration Schemes".

* cited by examiner

UNLANDED THERMAL DISSIPATION PILLAR ADJACENT ACTIVE CONTACT

BACKGROUND

The present disclosure relates to semiconductor devices, and more specifically, to an unlanded, thermal dissipation pillar adjacent an active contact for an electrical device that includes a higher thermal conductivity material than the active contact.

Heat buildup in semiconductor devices can degrade performance and reliability. Bipolar transistors such as those used in radio frequency devices, e.g., NPN devices, are especially susceptible to overheating because the main thermal conduction paths away from the devices are through poor thermal conducting structures, e.g., semiconductor substrate, dielectric layers, or tungsten contacts. Providing a simple and improved thermal conductivity to semiconductor devices has proven challenging.

SUMMARY

An aspect of the disclosure is directed to a structure, comprising: an electrical device; an active contact landed on a portion of the electrical device, the active contact including a first body of a first material; and a thermal dissipation pillar adjacent the active contact and unlanded on but over the portion of the electrical device, the thermal dissipation pillar including a second body of a second material having a higher thermal conductivity than the first material.

Another aspect of the disclosure includes a bipolar transistor, comprising: an emitter, a collector and a base over a substrate; an active contact landed on a portion of the emitter, the active contact including a first body of a first material; and a thermal dissipation pillar adjacent the active contact and unlanded on but over the portion of the emitter, the thermal dissipation pillar including a second body of a second material having a higher thermal conductivity than the first material.

An aspect of the disclosure related to an electrical device of an integrated circuit, the electrical device comprising: a portion that generates heat; a dielectric layer over the portion; an active contact extending through the dielectric layer and landed on the portion, the active contact including a first body of a first material; and a thermal dissipation pillar adjacent the active contact, the thermal dissipation pillar having a lowermost end over the dielectric layer and unlanded on but over the portion, the thermal dissipation pillar including a second body of a second material having a higher thermal conductivity than the first material.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
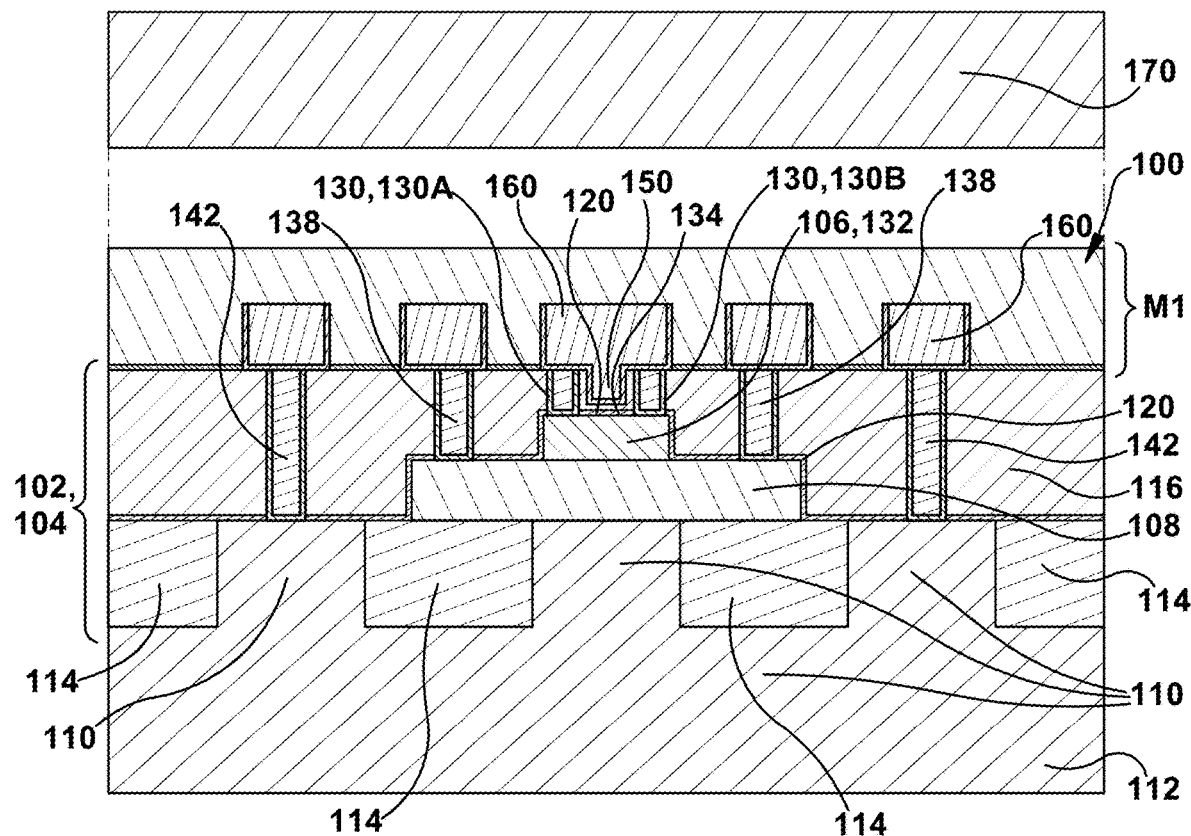
FIG. 1 shows a cross-sectional view of a structure including a thermal dissipation pillar adjacent an active contact that is unlanded on but over a portion of a bipolar transistor, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure include a structure including an electrical device, and an active contact landed on a portion of the electrical device. The active contact includes a first body of a first material. A thermal dissipation pillar is adjacent the active contact and unlanded on but over the portion of the electrical device. The thermal dissipation pillar includes a second body of a second material having a higher thermal conductivity than the first material. The thermal dissipation pillar may be in thermal communication with a wire in a dielectric layer over the active contact and the thermal dissipation pillar. The electrical device can be any element in an integrated circuit device that generates heat. The thermal dissipation pillar provides improved cooling to the electrical device compared to active contacts and dielectric layers thereabout, and may provide a lower resistance path to a first metal layer (M1) via lateral conduction from the active contact to the thermal dissipation pillar. The arrangement of the pillar and active contact can be customized for the electrical device. The thermal dissipation pillar can be used with any electrical device that has space for the pillar. The structure can be applied to a wide variety of electrical devices, but is advantageous for bipolar transistors (e.g., NPN with central emitter) in radio frequency applications.

Figure 2:
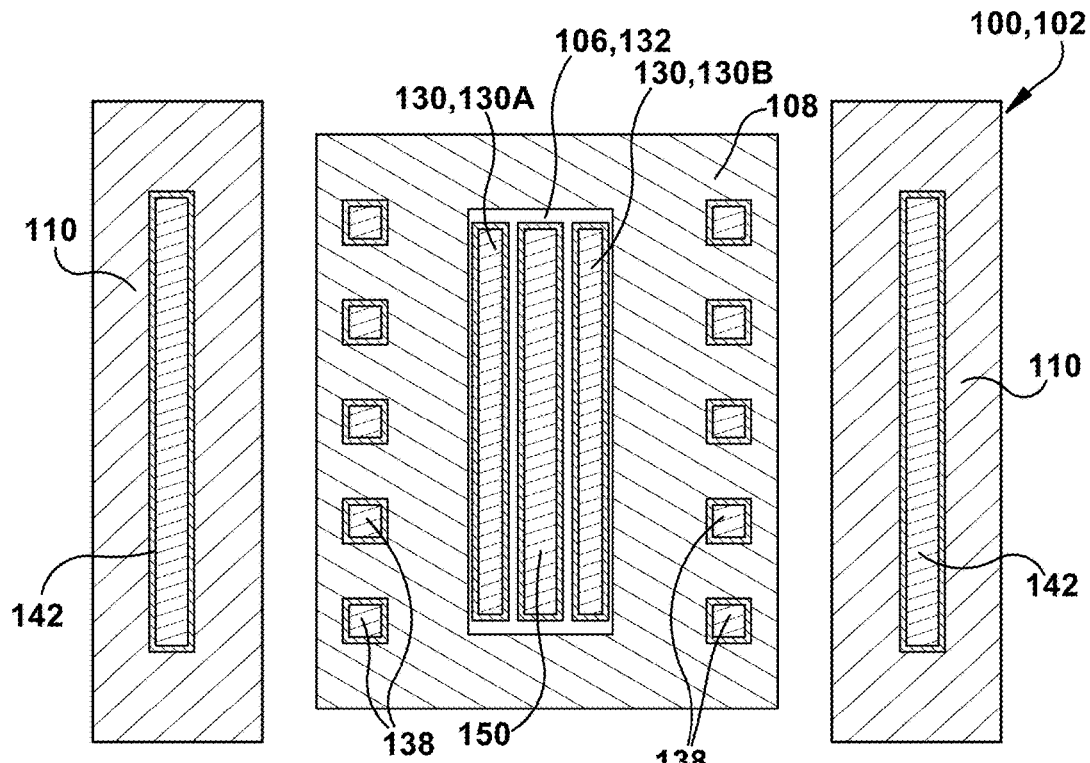
FIG. 2 shows a top down view of a structure including a thermal dissipation pillar unlanded on but over a portion of a bipolar transistor, according to embodiments of the disclosure.
Figure 3:
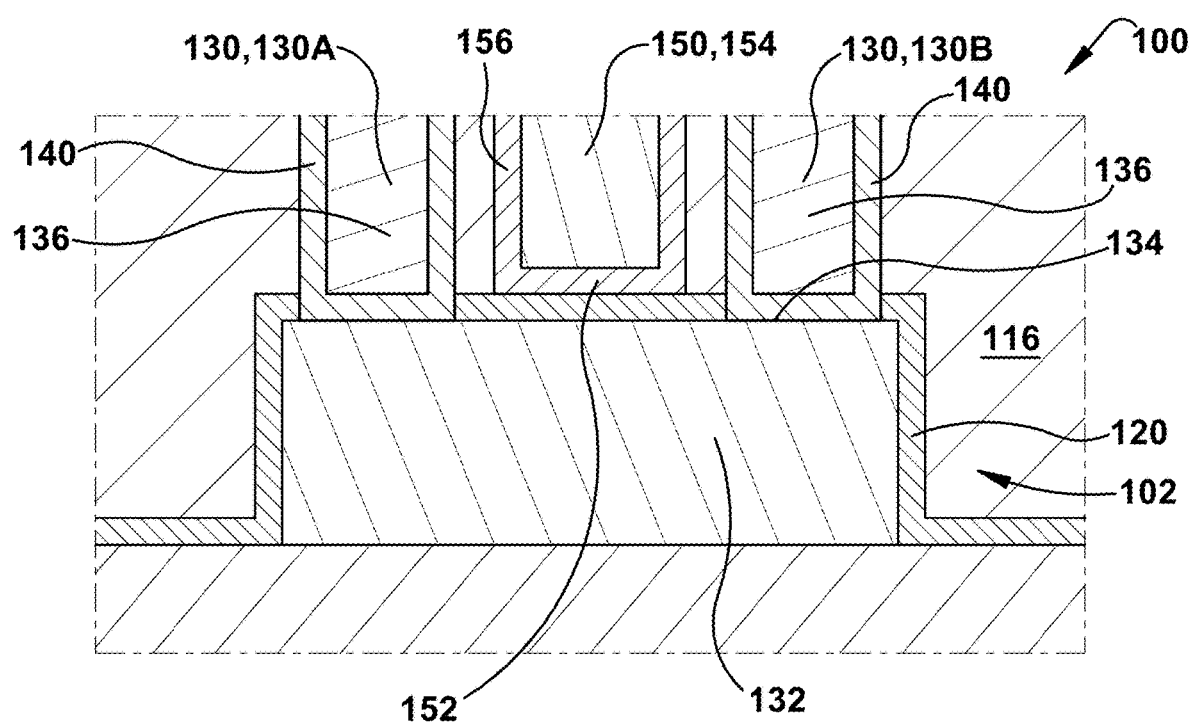
FIG. 3 shows an enlarged cross-sectional view of a structure including an unlanded thermal dissipation pillar adjacent an active contact on a portion of an electrical device, according to embodiments of the disclosure.

FIG. 1 shows a cross-sectional view and FIG. 2 shows a top down view of a structure 100, and FIG. 3 shows an enlarged cross-sectional view of part of structure 100, according to embodiments of the disclosure. Structure 100 includes an electrical device 102. Electrical device 102 can be any of a wide variety of devices found in integrated circuit (IC) structures that generate heat and can be aided by heat transfer therefrom, including active and passive devices. In FIG. 1, electrical device 102 includes a bipolar transistor 104. In this example, bipolar transistor 104 includes an emitter 106, base 108 and collector 110. Collector 110 may be in any form of semiconductor substrate 112 and can be defined, in part, by trench isolations 114. Base 108 and emitter 106 may be formed in semiconductor segments defined in an interlayer dielectric layer(s) (ILD) 116. Bipolar transistor 104 may include, for example, an NPN transistor with an n-type emitter 106, p-type base 108 and n-type collector 110. The teachings of the disclosure are applicable to any type of IC device that generates heat including but not limited to active devices such as bipolar transistors, high electron mobility transistors (HEMT) or metal-oxide semiconductor transistors. The teachings of the disclosure are applicable to passive devices that generate heat such as but not limited to resistors, capacitors, etc.

A thin dielectric layer 120 may extends over parts of electrical device, e.g., bipolar transistor 104. Dielectric layer 120 may have a thickness of approximately 50 nanometers. Dielectric layer 120 can include any now known or later developed cap layer or etch stop layer material such as silicon nitride, to prevent conductors such as tungsten, cobalt or copper, from diffusing into portions of electrical device 102. While dielectric layer 120 is shown in most embodiments, it is not necessary in all instances so long as another material is between lowermost end 152 (FIGS. 3-4) of pillar(s) 150 and portion 132 of electrical device 102, such as ILD 116. (See e.g., FIG. 11).

Structure 100 also includes an active contact 130 landed on a portion 132 of electrical device 102. In FIGS. 1-3, two active contacts 130 (hereafter "contact(s) 130") are shown landed on portion 132 of electrical device 102. As shown in FIG. 3, "landed" indicates that active contact(s) 130 contact an upper surface 134 of portion 132. In FIGS. 1-3, portion 132 of electrical device 102 includes emitter 106, which typically is a part of the device that benefits from thermal dissipation in an NPN-type bipolar transistor 104. "Active contact(s)" 130 is referred to as 'active' because it carries out some operative function of electrical device 102 such as carrying an electrical signal. Active contact(s) 130 may include a first body 136 of a first material having a first thermal conductivity. In certain embodiments, active contact(s) 130 may include a tungsten or cobalt contact.

Referring to FIG. 3, active contact(s) 130 may include a refractory metal liner 140 to prevent electromigration of tungsten (W) into adjacent ILD 116. For a tungsten contact, refractory metal liner 140 may include, for example, titanium nitride (TiN), titanium (Ti) or sputtered tungsten (W). For a cobalt contact, refractory metal liner 140 may include, for example, titanium nitride (TiN), tantalum (Ta), or tantalum nitride (TaN). First body 136 of active contact(s) 130 may include, for example, tungsten (W) or cobalt (Co). Tungsten has a thermal conductivity of approximately 182 Watts per meter Kelvin (W/mK), and cobalt has a thermal conductivity of approximately 104 W/mK. Other (first) materials having similar thermal conductivities are also possible for active contact(s) 130. Active contacts 130 extend through dielectric layer 120 to directly contact portion 132 of electrical device 102. More particularly, liner 140 of active contact(s) 130 directly contact or touch portion 132.

As shown in FIGS. 1 and 2, it will be observed that electrical device 102 may also include a multitude of active contacts 138 to base 108, and a multitude of active contacts 142 to collector 110. In FIGS. 1 and 2, active contacts 138 are shown as cylinder type contacts, and active contacts 130, 142 are shown as bar type contacts, the latter having a length into-and-out of the page in FIG. 1. It is emphasized that while active contacts 130, 138, 142 are each shown either as cylinder or bar type contacts, the teachings of the disclosure are equally applicable to any type (shape) of contact.

Returning to FIG. 3, structure 100 also includes a thermal dissipation pillar 150 adjacent active contact 130 and unlanded on but over portion 132 of electrical device 102. In FIGS. 1-3, one thermal dissipation pillar 150 is shown between two active contacts 130, but any number of pillars 150 may be used. As used herein, "unlanded on but over" indicates that thermal dissipation pillar 150 (hereafter "pillar(s) 150") extends vertically over and above portion 132 of electrical device 102 (FIGS. 1-2) but does not directly contact portion 132. As shown in FIG. 3, pillar(s) 150 may have a lowermost end 152 that lands on dielectric layer 120 but does not penetrate it. Alternatively, as shown in the enlarged cross-sectional view of FIG. 4A, pillar(s) 150 may have lowermost end 152 terminate in ILD 116. FIG. 4B shows a similar structure as FIG. 4A but illustrating the structure without liners 140, 156. Any of the embodiments described herein can be implemented without liners. In any event, dielectric layer 120 or ILD 116 may be between lowermost end 152 of pillar(s) 150 and portion 132 of electrical device 102. Nesting pillar(s) 150 within active contact(s) 130, as in FIGS. 1-3, is advantageous to protect electrical device 102 that may be sensitive to parasitic losses.

Pillar(s) 150 includes a second body 154 of a second material having a higher thermal conductivity than the first material of active contact(s) 130. In one example, second body 154 of pillar(s) 150 may include copper (Cu). Pillar(s) 150 may also include a refractory metal liner 156 to prevent electromigration of copper (Cu) into, among other structures, adjacent ILD 116. For a copper pillar 150, refractory metal liner 156 may include, for example, tantalum (Ta), tantalum nitride (TaN), a combination of Ta and TaN, and other materials. Second body 154 of pillar(s) 150 may include, for example, copper (Cu). Copper (Cu) has a thermal conductivity of approximately 401 W/mK, which is significantly higher than that of tungsten (W) or cobalt (Co) of active contact(s) 130. Other (second) materials having similar thermal conductivities are also possible for pillar(s) 150. In FIGS. 1 and 2, pillar(s) 150 are shown as bar type elements, i.e., they have a length into-and-out of the page in FIG. 1. It is emphasized that while pillar(s) 150 are each shown as bar type elements, the teachings of the disclosure are equally applicable to any type (shape) pillar such as cylindrical.

As shown in FIG. 1, pillar(s) 150 and active contact(s) 130 may be self-aligned. That is, active contacts 130 define a lateral extent of a pillar 150 defined therebetween, or vice versa, pillars 150 define a lateral extent of an active contact 130 formed therebetween—see e.g., FIG. 7.

Active contact(s) 130 may be formed using any now known or later developed contact forming process. Pillar(s) 150 may be formed, for example, as part of a dual damascene process for first metal layer M1 after active contact(s) 130 formation. With further regard to pillar(s) 150 and with reference to FIG. 1, in one example process flow, a lower part of ILD 116 would be formed over dielectric layer 120, and openings for pillar(s) 150 formed therein to dielectric layer 120, e.g., patterned mask, etching and removal of the mask. A temporary filler (e.g., near frictionless carbon or an anti-reflective coating) (not shown) would fill the openings. An upper part of ILD 116 would then be formed, and openings for wire(s) 160 of first metal layer M1 would be formed therein, e.g., patterned mask, etching and removal of the mask. The removal of the mask would also remove the temporary filler, allowing deposition (and subsequent planarization) of the second material to form pillar(s) 150 and wire(s) 160 together. Wire(s) 160 include the same material as pillar(s) 150, i.e., liner 156 (FIGS. 3-4) and the second material such as copper (Cu). Wire(s) 160 can be in electrical communication and thermal communication to any number of other copper back-end-of-line (BEOL) layers 170. Where pillar(s) 150 are formed as part of a partial or full copper back-end-of-line (BEOL) interconnect arrangement, thermal dissipation from portion 132 of electrical device 102 can be increased. The increased thermal conductivity may arise from the high thermal conductivity path formed by pillar(s) 150 and the copper BEOL layers 170, including wire(s) 160 in first metal layer (M1) among other metal layers. Wire(s) 160 are in thermal communication with pillar(s) 150. Wire(s) 160 coupled to pillar(s) 150 may also be in electrical communication with active contact(s) 130, although other wires than those coupled to pillar(s) 150 may also be coupled to active contact(s) 130.

In operation, pillar(s) 150 provide a higher thermal conductivity path away from portion 132 of electrical device 102 compared to, for example, active contact(s) 130, ILD 116 or semiconductor substrate 112. Pillar(s) 150 are relatively simple structures compared to other complex heat transfer structures typically provided to dissipate heat. Pillar(s) 150 are also relatively easy to form, and do not require complex fabrication steps, e.g., like through silicon vias (TSV) in semiconductor substrate 112 or other heat transfer structures typically provided to dissipate heat.

Structure 100 including pillar(s) 150 for thermal dissipation of portion 132 of electrical device 102 can take a variety of forms. As shown in FIGS. 1-4, active contact 130 may include a first active contact 130A landed on portion 132 of electrical device 102 and a second active contact 130B landed on portion 132 of electrical device 102. First active contact 130A is spaced from second active contact 130B sufficiently so that pillar 150 may extend between first active contact 130A and second active contact 130B. Active contacts 130A, 130B are landed on portion 132 of electrical device 102, but pillar 150 is unlanded on but over portion 132 of electrical device 102.

FIGS. 5-11 show alternative embodiments of structure 100 including thermal dissipation pillar(s) 150 adjacent active contact(s) 130.

Figure 4A:
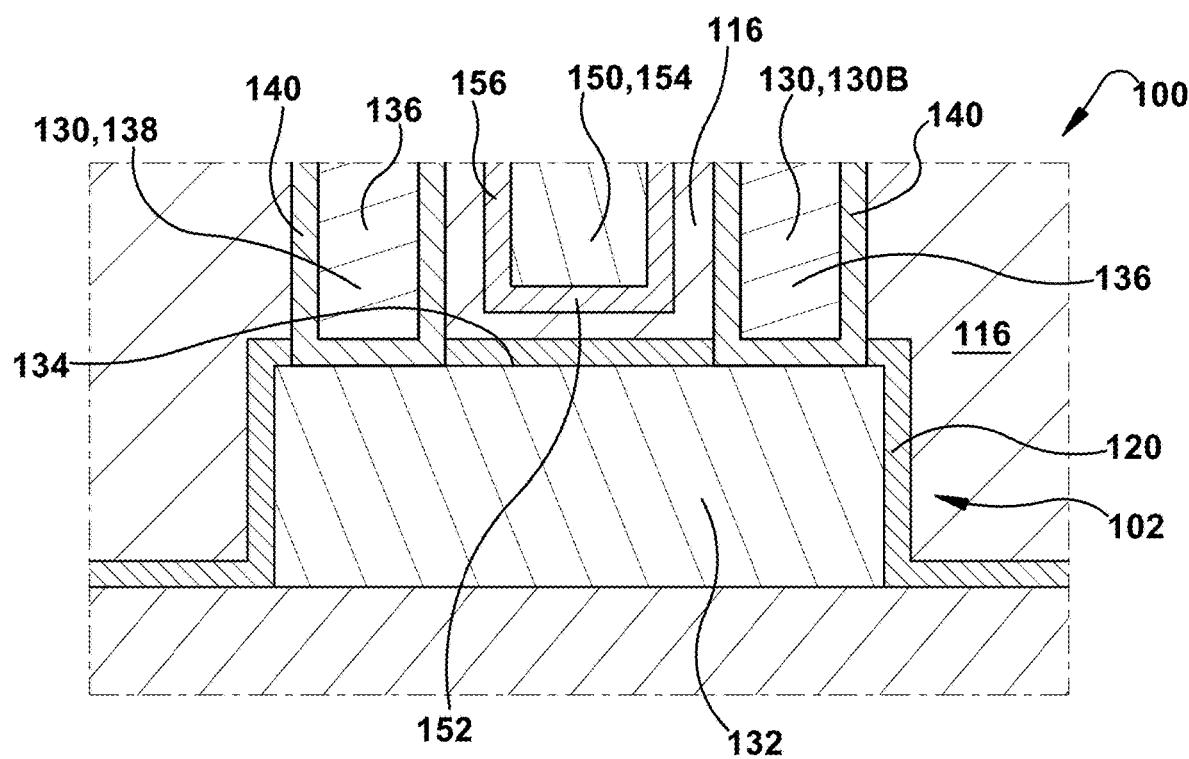
FIG. 4A shows an enlarged cross-sectional view of a structure including a thermal dissipation pillar adjacent an active contact an unlanded on but over a portion of an electrical device, according to other embodiments of the disclosure.
Figure 4B:
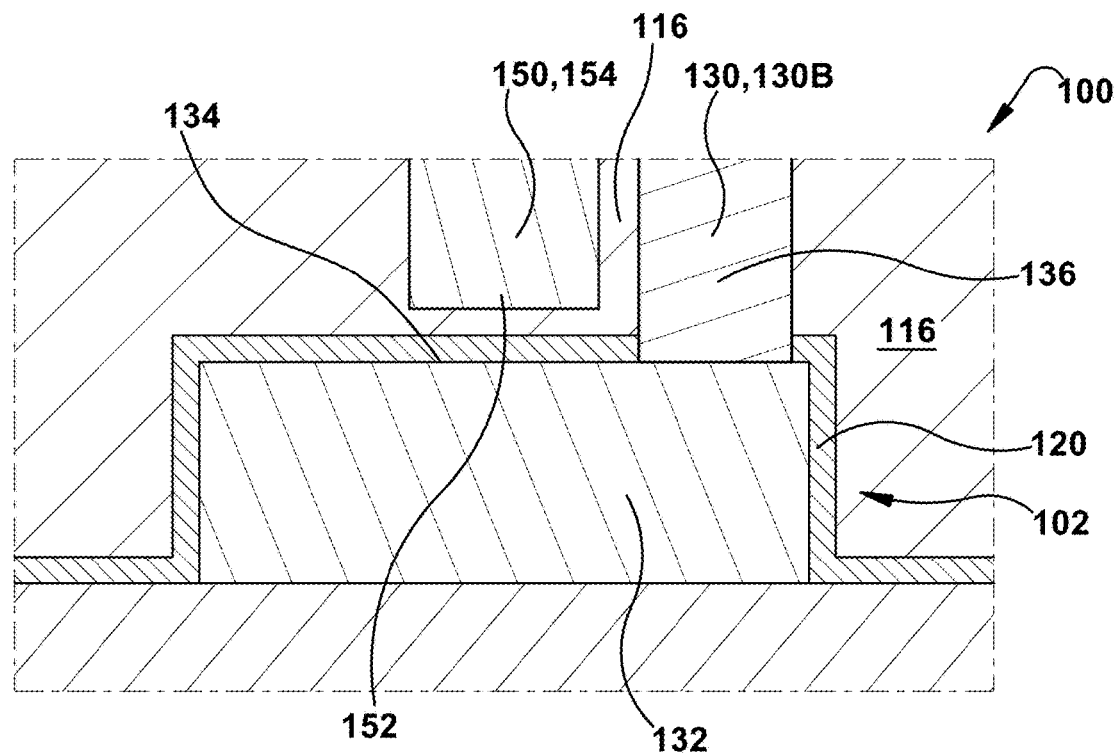
FIG. 4B shows an enlarged cross-sectional view of a structure including a thermal dissipation pillar adjacent an active contact and unlanded on but over a portion of an electrical device, according to other embodiments of the disclosure.
Figure 5:
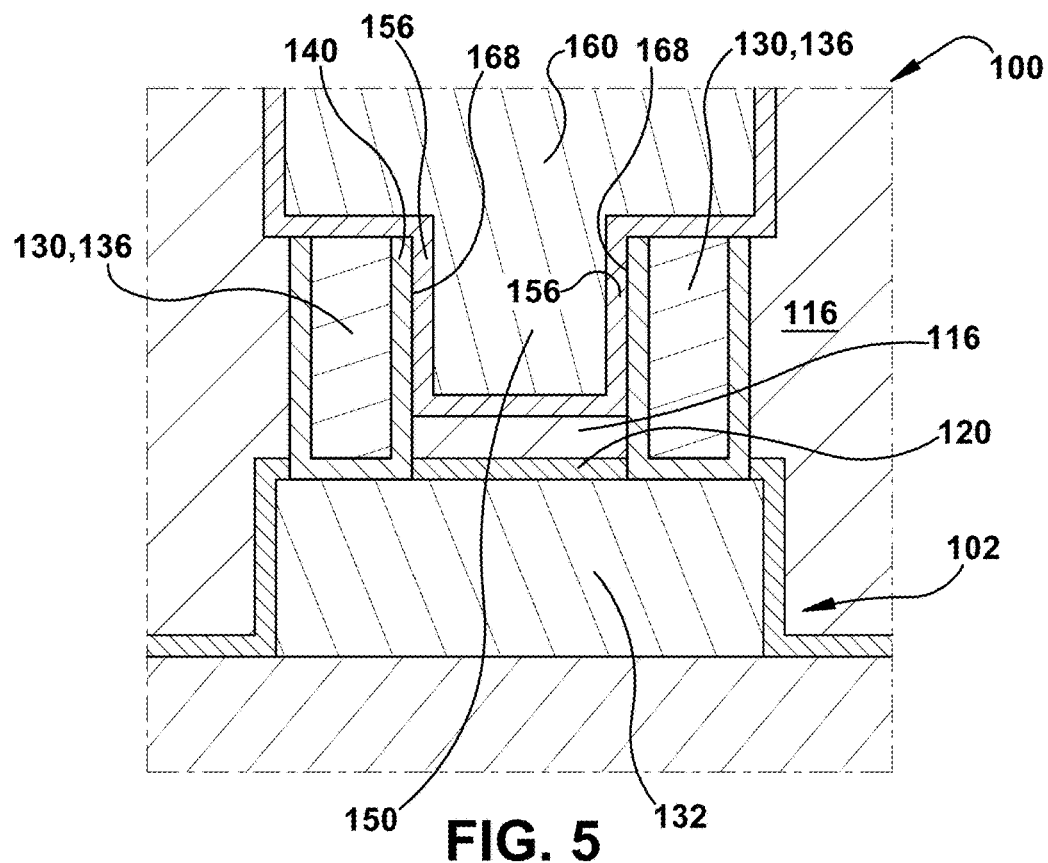
FIG. 5 shows an enlarged cross-sectional view of a structure including a thermal dissipation pillar in contact with adjacent active contact(s) unlanded on but over a portion of an electrical device, according to additional embodiments of the disclosure.

FIG. 5 shows an enlarged cross-sectional view, similar to FIG. 4A, except pillar(s) 150 is/are in contact with a sidewall 168 of active contact(s) 150. In this example, liner 156 of pillar(s) 150 contacts liner 140 of active contact(s) 130.

Figure 6:
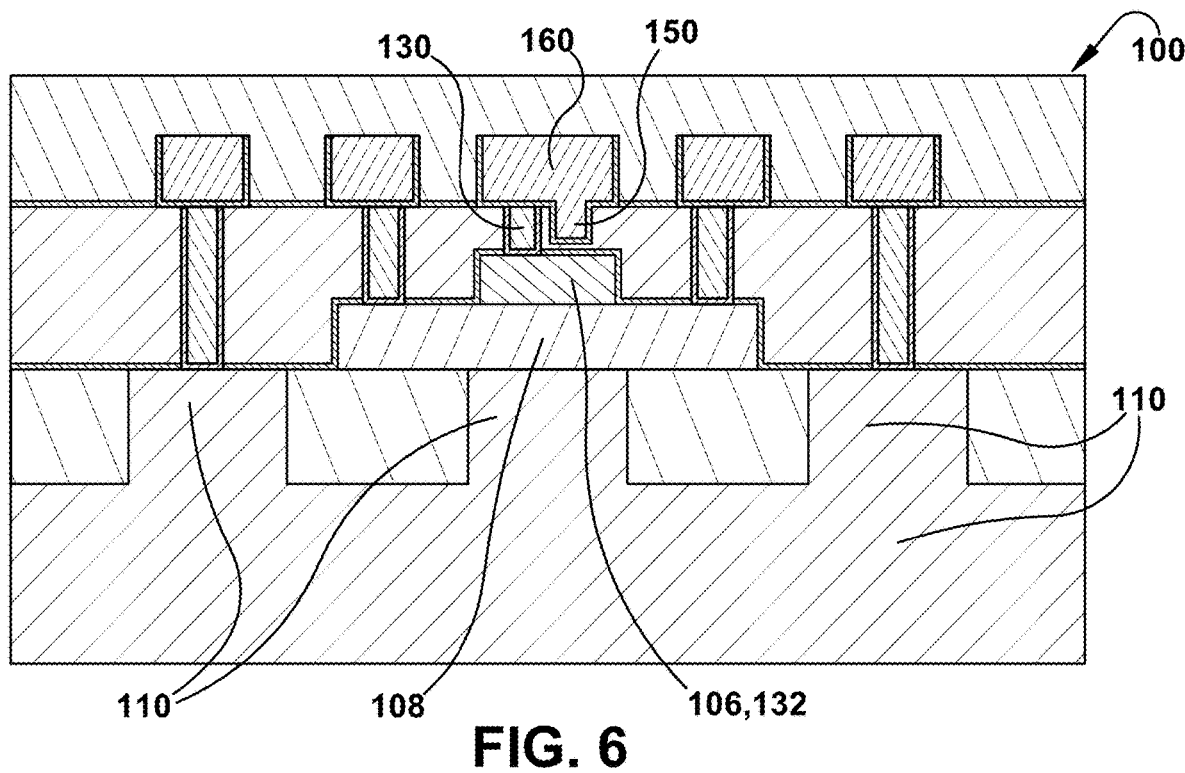
FIG. 6 shows an enlarged cross-sectional view of a structure including a thermal dissipation pillar adjacent an active contact unlanded on but over a portion of a bipolar transistor, according to yet other embodiments of the disclosure.

FIG. 6 shows an enlarged cross-sectional view in which one pillar 150 is adjacent one active contact 130. Pillar 150 can be on either side of active contact 130.

Figure 7:
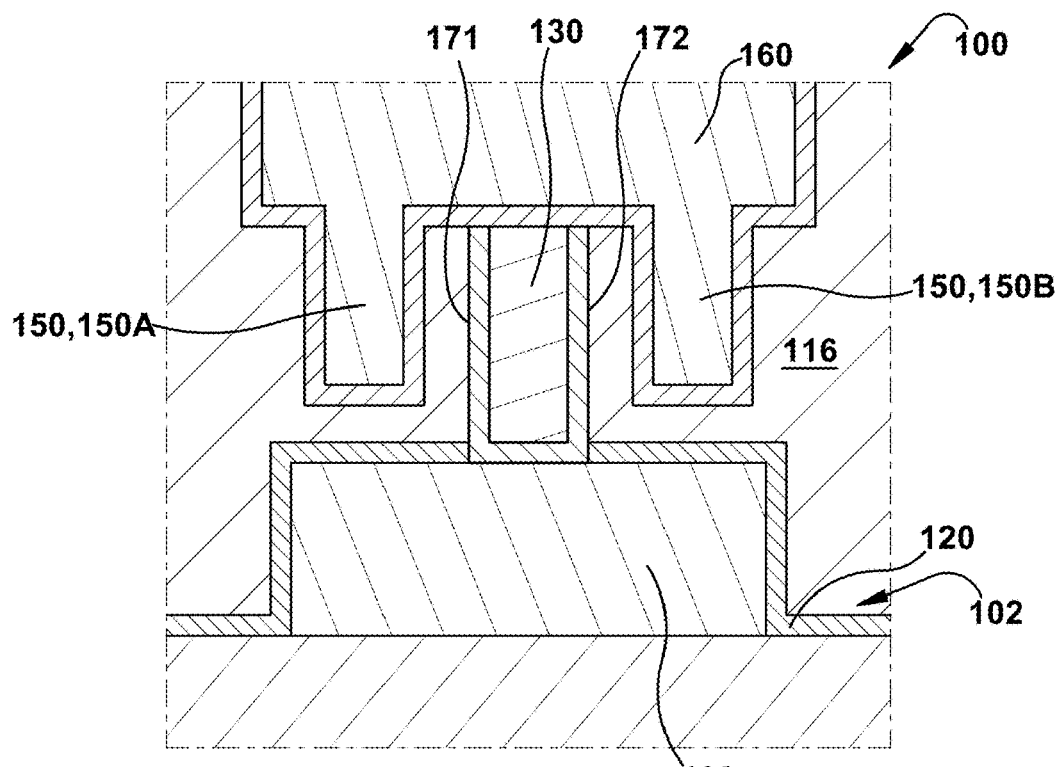
FIG. 7 shows an enlarged cross-sectional view of a structure including a pair of thermal dissipation pillars adjacent an active contact and unlanded on but over a portion of an electrical device, according to embodiments of the disclosure.

FIG. 7 shows an enlarged cross-sectional view in which pillar(s) 150 includes a first thermal dissipation pillar 150A adjacent to a first side 171 of an active contact 130, and a second thermal dissipation pillar 150B adjacent to a second side 172 of the same active contact 130. Each pillar 150A, 150B is unlanded on but over portion 132 of electrical device 102.

Figure 8:
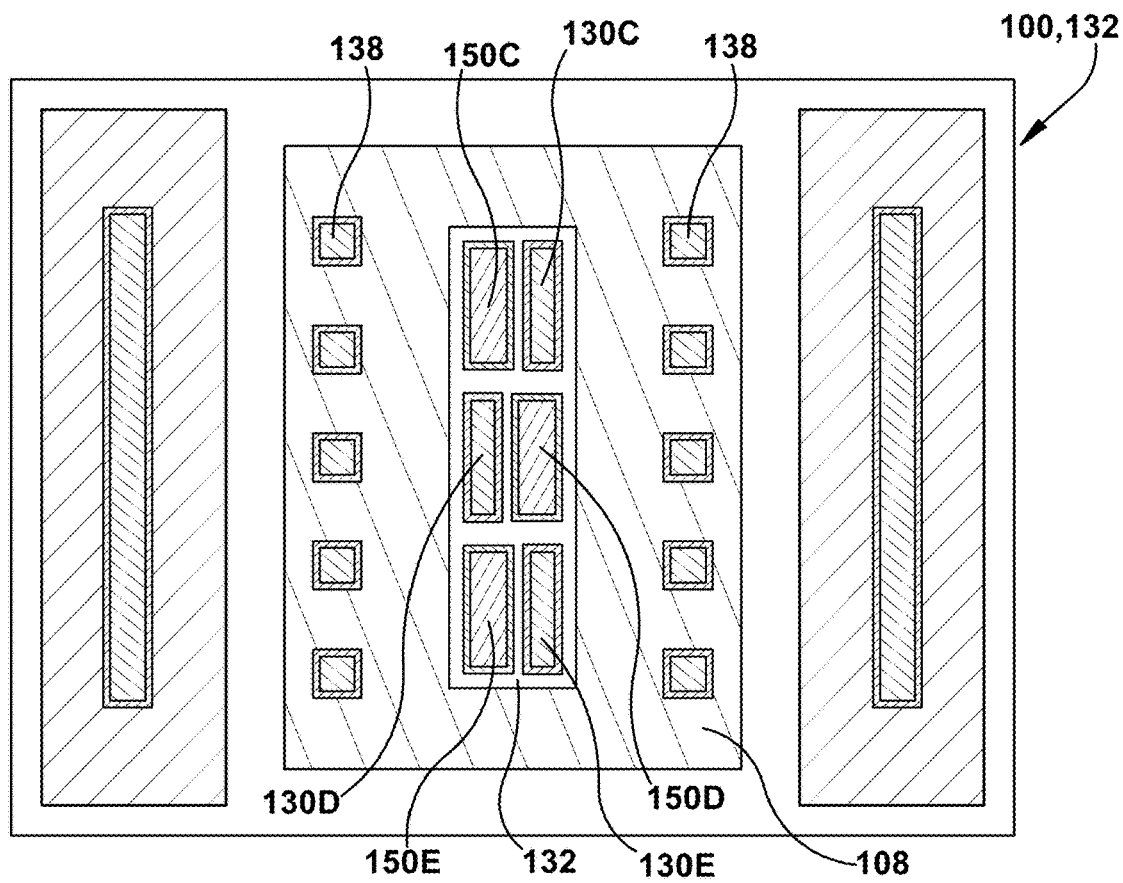
FIG. 8 shows a top down view of a structure including a plurality of a thermal dissipation pillars interspersed with a plurality of adjacent active contacts and unlanded on but over a portion of an electrical device, according to embodiments of the disclosure.

FIG. 8 shows a top down view of structure 100 in which active contact 130 includes a plurality of active contacts 130C-E landed on portion 132 of electrical device 102, and pillar 150 includes a plurality of thermal dissipation pillars 150C-E unlanded on but over portion 132 of electrical device 102. Plurality of active contacts 130C-E are interspersed with plurality of thermal dissipation pillars 150C-E, e.g., they alternate in position. While a particular example of interspersion of pillars 150 and active contacts 130 are shown, they may be arranged in any manner. While three of active contacts 130C-E and three pillars 150C-E are shown, any number and any shape of each may be employed.

Figure 9:
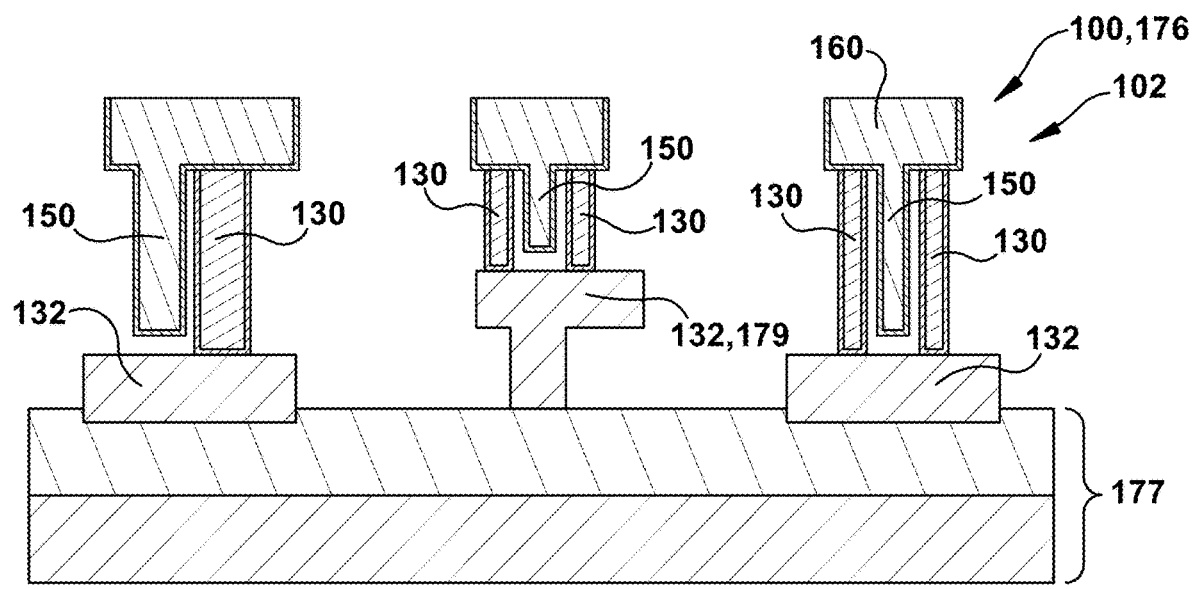
FIG. 9 shows an enlarged cross-sectional view of a structure including various arrangements of a thermal dissipation pillar adjacent an active contact and unlanded on but over different portions of a high electron mobility transistor (HEMT), according to other embodiments of the disclosure.

FIG. 9 shows a cross-sectional view of structure 100 in the form of an HEMT 176 with various forms of pillar 150 and active contacts 130 to various parts of HEMT 176. For purposes of description, different arrangements of pillar(s) 150 and active contact(s) 130 are shown for different parts of HEMT 176. In the examples shown in FIG. 9, the leftmost option shows a single pillar 150 adjacent a single active contact 130 to one portion 132 of HEMT 176, the middle and rightmost options show a single pillar 150 between a pair of active contacts 130 to other portions 132 of HEMT 176, but with the rightmost option having a greater vertical extent. In HEMT 176, the leftmost portion 132 and the rightmost portion 132 are source/drain metals (e.g., of aluminum (Al)) that extend to a gallium-nitride (GaN) stack 177 thereunder. Portion 132 in the center option is a gate metal 179 (e.g., aluminum). (It is noted that the same arrangement of pillar(s) 150 and active contact(s) 130 would typically be used for similar portions 132 of a particular electrical device 102, like source/drain regions in HEMT 176. However, different arrangements can be used for similar portions 132 in a single electrical device 102, if desired. HEMT 176 has different arrangements for its source/drain regions for purposes of description.) Gate metal 179 terminates atop GaN stack 177 without penetrating the topmost layer (e.g., aluminum gallium nitride (AlGaN)), creating an HEMT. Alternatively, gate metal 179 may be separated from the GaN stack 177 by a thin dielectric layer (not shown), creating metal-insulator-semiconductor HEMT (MISH-EMT) (and perhaps more particularly, a metal-oxide-semiconductor HEMT (MOSHEMT) if the thin dielectric layer includes oxide). It is noted that gate metal 179 in HEMT 176 is often T-shaped and asymmetrical, as shown, to provide a field plate to enhance performance.

Figure 10:
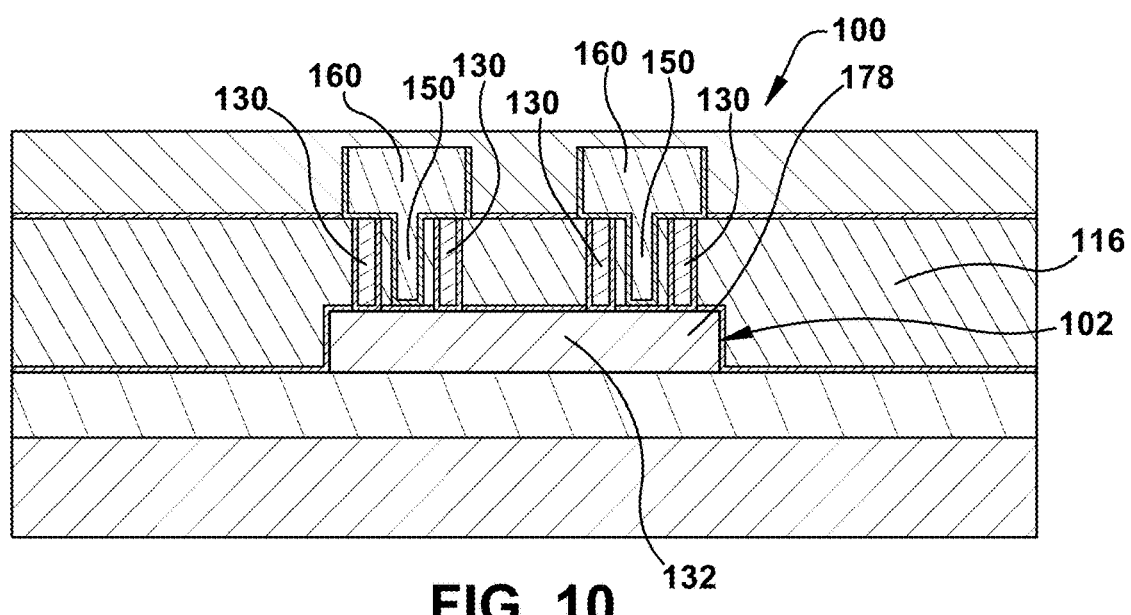
FIG. 10 shows an enlarged cross-sectional view of a structure including a thermal dissipation pillar adjacent an active contact and unlanded on but over a polysilicon resistor, according to embodiments of the disclosure.

FIG. 10 shows a cross-sectional view of structure 100 with electrical device 102 in the form a polysilicon resistor 178.

Figure 11:
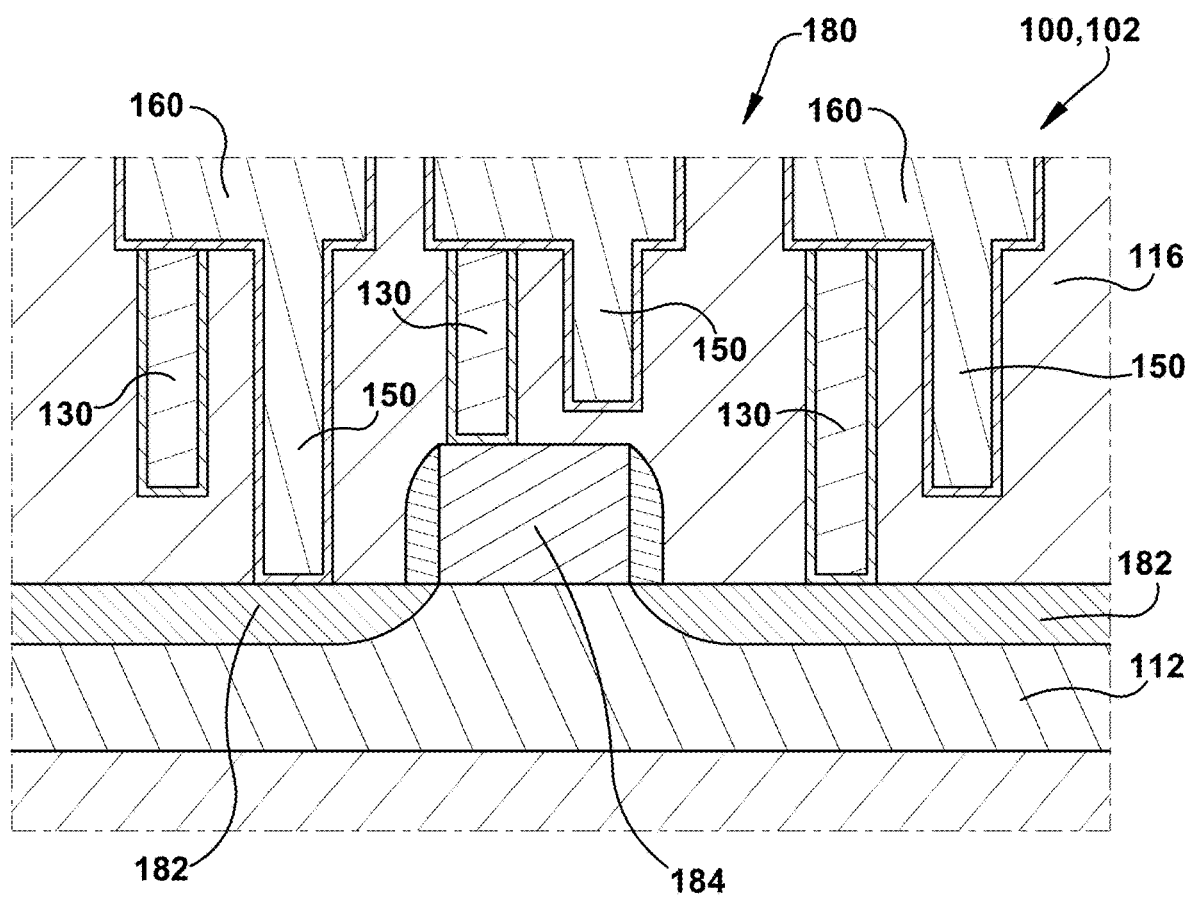
FIG. 11 shows an enlarged cross-sectional view of a structure including a thermal dissipation pillar adjacent an active contact and unlanded on but over a metal-oxide semiconductor transistor, according to embodiments of the disclosure.

FIG. 11 shows a cross-sectional view of structure 100 with electrical device 102 in the form of a metal-oxide semiconductor transistor 180. Pillar(s) 150 and active contact(s) 130 arrangements may be applied to any one or more of source/drain regions 182 or gate 184.

Pillar(s) 150 can be used wherever active contacts 130 are used, and sufficient space is available for their use. Structure 100 may include any electrical device 102 of an integrated circuit that includes portion 132 that generates heat, and perhaps with dielectric layer 120 over the portion. As noted, active contact(s) 130 extend through dielectric layer 120, are landed on portion 132, and include a first body 136 of a first material. Pillar(s) 150 are adjacent active contact(s) 130. Each pillar 150 has lowermost end 152 (FIGS. 3-4) over dielectric layer 120 and unlanded on but over portion 132. Pillar(s) 150 include second body 154 of a second material having a higher thermal conductivity than the first material of active contact(s) 130 so as to provide a higher thermal conductivity path away from portion 132 of electrical device 102.

The structures as described above are used in integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure, comprising:
   an electrical device;
   an active contact landed on a portion of the electrical device, the active contact including a first body of a first material;
   a thermal dissipation pillar adjacent the active contact, the thermal dissipation pillar unlanded on but over the portion of the electrical device, the thermal dissipation pillar including a second body of a second material having a higher thermal conductivity than the first material;
   a dielectric layer over the active contact and the thermal dissipation pillar; and
   a wire in the dielectric layer in thermal communication with the thermal dissipation pillar and in electrical communication with the active contact, wherein the wire is over and in physical contact with a top surface of the active contact and over a side surface of the active contact.

2. The structure of claim 1, wherein the first material includes one of tungsten (W) and cobalt (Co), and the second material includes copper (Cu).

3. The structure of claim 1, further comprising a dielectric layer between a lowermost end of the thermal dissipation pillar and the portion of the electrical device.

4. The structure of claim 1, wherein the thermal dissipation pillar and the active contact are self-aligned.

5. The structure of claim 1,
   wherein the wire includes the second material.

6. The structure of claim 1, wherein the thermal dissipation pillar includes a first thermal dissipation pillar adjacent to a first side of the active contact, and a second thermal dissipation pillar adjacent to a second side of the active contact, each thermal dissipation pillar unlanded on but over the portion of the electrical device.

7. The structure of claim 1, wherein the active contact includes a first active contact landed on the portion of the electrical device and a second active contact landed on the portion of the electrical device, wherein the first active contact is spaced from the second active contact and the thermal dissipation pillar extends between the first active contact and the second active contact.

8. The structure of claim 1, wherein the active contact includes a plurality of active contacts landed on the portion of the electrical device, and the thermal dissipation pillar includes a plurality of thermal dissipation pillars unlanded on but over the portion of the electrical device, and wherein the plurality of active contacts are interspersed with the plurality of thermal dissipation pillars.

9. The structure of claim 1, wherein the electrical device includes a bipolar transistor, and the portion of the electrical device includes an emitter of the bipolar transistor.

10. The structure of claim 1, wherein the electrical device includes one of a metal-oxide semiconductor (MOS) transistor and a high electron mobility transistor (HEMT).

11. The structure of claim 1, wherein the electrical device includes a polysilicon resistor.

12. The structure of claim 1, wherein the thermal dissipation pillar is in contact with a sidewall of the active contact.

13. A bipolar transistor, comprising:
    an emitter, a collector and a base over a substrate;
    a first active contact landed on a portion of the emitter and a second active contact landed on the portion of the emitter, the first and second active contacts including a first body of a first material; and
    a thermal dissipation pillar between the first active contact and the second active contact and unlanded on but over the portion of the emitter, the thermal dissipation pillar including a second body of a second material having a higher thermal conductivity than the first material.

14. The bipolar transistor of claim 13, wherein the first material includes one of tungsten (W) and cobalt (Co), and the second material includes copper (Cu).

15. The bipolar transistor of claim 13, further comprising a dielectric layer between a lowermost end of the thermal dissipation pillar and the portion of the emitter.

16. The bipolar transistor of claim 13, further comprising a dielectric layer over the first active contact, the second active contact, and the thermal dissipation pillar, and a wire in the dielectric layer in thermal communication with the thermal dissipation pillar and in electrical communication with the first active contact and the second active contact, wherein the wire includes the second material.

17. The bipolar transistor of claim 13, wherein the thermal dissipation pillar includes a first thermal dissipation pillar adjacent to a first side of the first active contact, and a second thermal dissipation pillar adjacent to a second side of the first active contact, each thermal dissipation pillar unlanded on but over the portion of the emitter.

18. The bipolar transistor of claim 13, further including a plurality of active contacts landed on the portion of the emitter, and the thermal dissipation pillar includes a plurality of thermal dissipation pillars unlanded on but over the portion of the emitter, and wherein the plurality of active contacts are interspersed with the plurality of thermal dissipation pillars.

19. An electrical device of an integrated circuit, the electrical device comprising:
    a portion that generates heat;
    a first dielectric layer over the portion;
    an active contact extending through the first dielectric layer and landed on the portion, the active contact including a first body of a first material;
    a thermal dissipation pillar adjacent the active contact, the thermal dissipation pillar having a lowermost end over the first dielectric layer and unlanded on but over the portion, the thermal dissipation pillar including a second body of a second material having a higher thermal conductivity than the first material;
    a second dielectric layer over the active contact and the thermal dissipation pillar; and
    a wire in the second dielectric layer in thermal communication with the thermal dissipation pillar and in electrical communication with the active contact, wherein the wire is over and in physical contact with a top surface of the active contact and over a side surface of the active contact.

20. The bipolar transistor structure of claim 13, wherein the first active contact includes a refractory metal liner.

* * * * *